(12) United States Patent
Sagar et al.

(10) Patent No.: US 11,978,776 B2
(45) Date of Patent: May 7, 2024

(54) NON-PLANAR SEMICONDUCTOR DEVICE HAVING CONFORMING OHMIC CONTACTS

(71) Applicant: Intel Corporation, Santa Clara, CA (US)

(72) Inventors: Ashutosh Sagar, Hillsboro, OR (US); Sridhar Govindaraju, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 383 days.

(21) Appl. No.: 16/461,071

(22) PCT Filed: Dec. 12, 2016

(86) PCT No.: PCT/US2016/066124
§ 371 (c)(1),
(2) Date: May 15, 2019

(87) PCT Pub. No.: WO2018/111218
PCT Pub. Date: Jun. 21, 2018

(65) Prior Publication Data
US 2020/0066841 A1    Feb. 27, 2020

(51) Int. Cl.
*H01L 29/417* (2006.01)
*H01L 21/8234* (2006.01)
(Continued)

(52) U.S. Cl.
CPC ............... *H01L 29/41791* (2013.01); *H01L 21/823418* (2013.01); *H01L 21/823431* (2013.01);
(Continued)

(58) Field of Classification Search
CPC ..... H01L 2029/7858; H01L 21/823418; H01L 29/41791; H01L 21/2855; H01L 21/28568;
(Continued)

(56) References Cited

U.S. PATENT DOCUMENTS 5,317,190 A * 5/1994 Fleischman ........... H01L 29/452
257/743
10,164,042 B2 * 12/2018 Yeo ................... H01L 29/41791
(Continued)

FOREIGN PATENT DOCUMENTS

WO    WO2015147842    10/2015

OTHER PUBLICATIONS

Okamoto, H., Massalski, T.B. The Au—Ge (Gold-Germanium) system. Bulletin of Alloy Phase Diagrams 5, 601-610 (1984). (Year: 1984).*

(Continued)

*Primary Examiner* — Alexander Sofocleous
*Assistant Examiner* — Diana C Vieira
(74) *Attorney, Agent, or Firm* — Trop, Pruner & Hu, P.C.

(57) ABSTRACT

An apparatus includes a non-planar semiconductor body; and a contact for the semiconductor body. The contact includes an epitaxial material that is formed on and contacts the semiconductor body. The contact includes a second material that is formed on and contacts the epitaxial material; and the second material at least partially conforms to an undercut of the epitaxial material.

9 Claims, 9 Drawing Sheets

(51) Int. Cl.
  *H01L 29/45* (2006.01)
  *H01L 29/66* (2006.01)
  *H01L 29/78* (2006.01)

(52) U.S. Cl.
  CPC .... *H01L 29/66795* (2013.01); *H01L 29/7851* (2013.01); *H01L 29/7853* (2013.01); *H01L 29/456* (2013.01); *H01L 29/785* (2013.01); *H01L 2029/7858* (2013.01); *H01L 2224/16502* (2013.01); *H01L 2924/01322* (2013.01); *H01L 2924/014* (2013.01)

(58) Field of Classification Search
  CPC ............. H01L 29/665; H01L 21/28052; H01L 2224/16502; H01L 2924/014; H01L 2924/01322; H01L 29/823431; H01L 29/66795; H01L 29/785; H01L 2924/0132–014; H01L 21/823431
  See application file for complete search history.

(56) References Cited

U.S. PATENT DOCUMENTS

| | | |
|---|---|---|
| 2011/0298058 A1 | 8/2011 | Kawasaki et al. |
| 2013/0056827 A1 | 3/2013 | Tsai et al. |
| 2013/0277752 A1* | 10/2013 | Glass ................ H01L 29/66636 |
| | | 257/369 |
| 2015/0249131 A1 | 9/2015 | Chu-Kung et al. |
| 2016/0093720 A1 | 3/2016 | Chudzik et al. |

OTHER PUBLICATIONS

D. Matsuoka, M. Smith, O.S. Es-Said, The attachment of thin alumina ceramic plates to Kovar® using gold germanium solder, Engineering Failure Analysis, vol. 5, Issue 1, pp. 69-75 (1998). (Year: 1998).*

International Search Report for International Application No. PCT/US2016/066124, filed Dec. 12, 2016; 11 pp.

* cited by examiner

NON-PLANAR SEMICONDUCTOR DEVICE HAVING CONFORMING OHMIC CONTACTS

BACKGROUND

A semiconductor device (a transistor, a diode, a resistor, and so forth) may have non-rectifying electrical junctions, called "ohmic contacts," which are associated with the electrical terminals of the device and which may be used to electrically connect the device to an interconnect structure and/or other devices. For example, a metal oxide semiconductor field effect transistor (MOSFET) may have semiconductor regions (n-type doped regions for an n-channel MOSFET, for example) that correspond to the drain and source of the MOSFET; and ohmic contacts may be formed for the drain and source.

One way to form an ohmic contact is to deposit metal on a semiconductor to form a corresponding metal-semiconductor junction. Materials (a silicide, for example) other than a metal may be used to form an ohmic contact.

DETAILED DESCRIPTION

Reference will now be made to the drawings wherein like structures may be provided with like suffix reference designations. In order to show the structures of various implementations more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated implementations. Moreover, the drawings may only show the structures useful to understand the illustrated implementations. Additional structures known in the art may not have been included to maintain the clarity of the drawings. For example, not every layer of a semiconductor device is necessarily shown. "An implementation", "various implementations" and the like indicate implementation(s) so described may include particular features, structures, or characteristics, but not every implementation necessarily includes the particular features, structures, or characteristics. Some implementations may have some, all, or none of the features described for other implementations. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Ohmic contacts may be used to electrically connect semiconductor devices to an interconnect structure and/or other semiconductor devices. A given ohmic contact may include one or multiple materials that are formed on a semiconductor material. As a more specific example, the semiconductor device may be a complementary metal oxide semiconductor (CMOS) transistor, and ohmic contacts may be formed on the drain and source, for example, of the transistor. In general, lower ohmic contact resistances may enhance the performance of the transistor (may allow a larger conductive channel current, for example).

An ohmic contact may be a metal-semiconductor junction that is formed by depositing a metal on a semiconductor. However, the resistance of the ohmic contact may be reduced by using a contact resistance reducing material, such as, for example, a silicide or germanide of one or multiple metals, such as nickel, platinum, titanium, cobalt, and so forth. As a more specific example, an ohmic contact may include an epitaxial silicide or germanide film that is grown on the semiconductor using a vapor-phase epitaxy (VPE) process. More specifically, the epitaxial film may be formed after the source/drain region is formed and before a metal is deposited on the epitaxial film. Reaction annealing (i.e., a process in which heat is applied) may then be used to cause the deposited metal to react with the epitaxial film to form a compound, such as a silicide or a germanide. Thus, the resulting ohmic contact contains two layers on the semiconductor: an underlying epitaxial layer (a silicide or germanide epitaxial layer) that directly contacts the semiconductor and an upper layer (a silicide or germanide layer, for example) that is formed from the reaction of the deposited metal with the epitaxial layer.

For a non-planar transistor (such as a fin-based field effect transistor FinFET or nanowire transistor, for example) in which the source/drain region is part of a three-dimensional semiconductor structure (a fin or a nanowire, for example), it may be challenging to conform the deposited metal to some parts of the epitaxial film. For example, an ohmic contact may be formed on the transistor by growing an epitaxial silicide or germanide film on the drain/source region and then depositing a metal on the deposited film using a process (a physical vapor deposition (PVD), for example) that has an associated line of sight (i.e., some surfaces are "visible" to the PVD process and receive the deposited metal, whereas other surfaces are effectively shadowed, or hidden, from the PVD process and do not receive the deposited metal). Due to this line of sight, the metal may not be deposited on an undercut, or hidden, region of the epitaxial film. As a result, the upper layer of the ohmic contact (i.e., the layer formed from the reaction of the deposited metal with the underlying epitaxial film) does not form in this hidden region, thereby imparting a higher resistance for the contact (as compared to the resistance of the ohmic contact if the reaction-formed layer extended to the hidden region).

In accordance with example implementations that are described herein, a process is used to form conforming ohmic contacts, which at least partially conform to regions that are hidden, or shadowed, by the process that is used to deposit a metal on an epitaxial film. More specifically, in accordance with example implementations, a thermal reflow process is used to flow the deposited metal to cause the metal to at least partially extend into the epitaxial film's undercut(s), or region(s) that were hidden from the process that was used to deposit the metal. Accordingly, the metal surface coverage may be increased, the amount of metal contacting the epitaxial film may be increased, and the resulting silicide/germanide formed by reacting the deposited metal with the epitaxial film may be increased. As a result, a conforming ohmic contact that is formed using this process may have such advantages as a lower resistance and/or a reduced Schottky barrier.

Figure 1A:
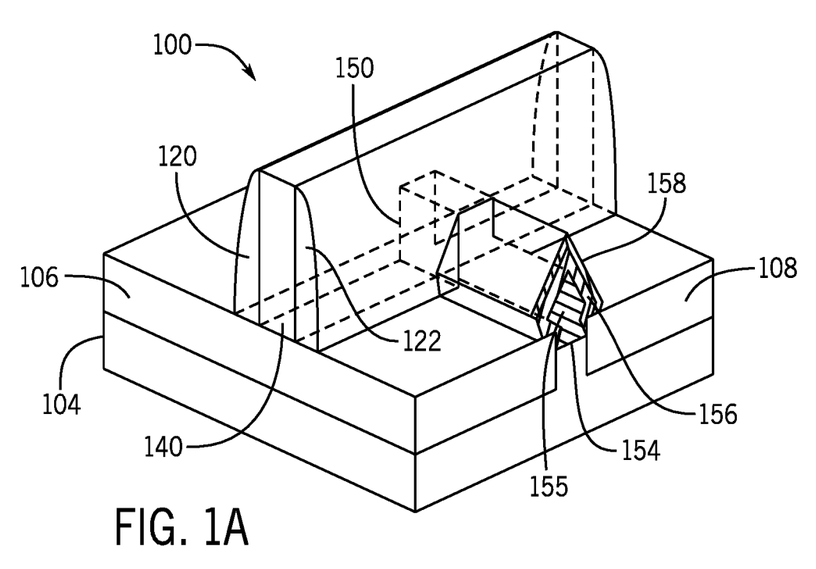
FIGS. 1A and 1B are perspective views of non-planar transistors according to example implementations.

FIG. 1A depicts a three-dimensional (3-D), or non-planar, complementary metal oxide semiconductor (CMOS) transistor 100 that has conforming drain and source ohmic contacts, in accordance with example implementations. More specifically, in accordance with example implementations, the transistor 100 is a fin-based field effect transistor (FinFET). In general, a FinFET is constructed around a relatively thin 3-D body of semiconductor material, called a "fin," which is illustrated at reference numeral 150 in FIG. 1A.

Unlike a two-dimensional (2-D), or planar, transistor, in which the gate of the transistor overlies a planar conducting channel, for the transistor 100, the drain and source are fabricated in the fin 150 to form a conductive channel on/within the outer sides of the fin 150 beneath a gate dielectric. Specifically, the conductive channel may include regions in which the current extends along both the sidewalls of the fin 150 (i.e., sides that are perpendicular to a substrate 104), as well as along the top surface of the fin 150 (i.e., the side parallel to the substrate surface 104). Because the conductive channel may have three outer, planar regions within the fin 150, the transistor 100 may be called a "tri-gate" FinFET. In accordance with further example implementations, the transistor 100 may be a "double gate" FinFET in which the conductive channel resides along two sidewalls of the fin 150.

The fin 150 is formed from or on the substrate 104. Isolation regions 106 and 108 are formed adjacent to the fin 150. The fin 150 has a greater height measured orthogonally from a surface of the substrate 104 than a top surface of the isolation regions 106 and 108, thereby exposing a top portion of the fin 150 over the isolation regions 106 and 108 as shown in FIG. 1A. This top portion may be referred to as an active portion of the fin 150. The isolation regions 106 and 108 may contain a dielectric material, such as silicon dioxide or any suitable dielectric/insulative material. A gate dielectric (not shown) is formed on the fin 150 and is in contact with three surfaces of the fin 150. The gate dielectric can be formed using elements such as hafnium, silicon, and oxygen. For instance, the gate dielectric may have one or more layers that include hafnium oxide, hafnium dioxide, and/or silicon dioxide. A gate electrode 140 is formed proximate to three surfaces of the fin 150 to form three corresponding gates for the transistor 100. Moreover, as depicted in FIG. 1A, gate spacers 120 and 122 may be formed on opposite sidewalls of the gate electrode 140. Outside of the spacers 120/122 the fin 150 also includes a drain and a source for the transistor 100. In this manner, the fin 150 includes a region on one side of the gate electrode 140 (such as the part of the fin 150 depicted in FIG. 1A, for example), which forms a drain for the transistor 100; and the fin 150 includes a region on the other side of the gate electrode 140 (not shown in FIG. 1A) which forms a source of the transistor 100.

Although the transistor 100 is depicted in FIG. 1A as having a single fin 150, the transistor 100 may have multiple fins, in accordance with example implementations. In this manner, the transistor 100 may have multiple drains and sources, and the gate electrode 140 may extend over multiple parallel fins, with each fin having a drain and source for the transistor 100.

Depending on the particular implementation, the substrate 104 may be a bulk substrate, a semiconductor-on-insulator substrate or a multi-layered substrate. As specific examples, the substrate 104 may be a germanium substrate, a silicon substrate, a silicon germanium bulk substrate, a germanium, or a semiconductor-on-insulator substrate, such as a germanium, silicon or a silicon germanium on oxide substrate.

For the example implementation of FIG. 1A, the fin 150 is formed from an etching and replacement process in which a portion of the substrate 104 is removed to form a trench 154, and a semiconductor material 155 is deposited in the trench 154. In this manner, the substrate 104 may first be etched to form the trench 154 at the location of the associated source and drain regions for the transistor 100. An epitaxial deposition process may then be performed to fill the trench 154 with the semiconductor material 155. As an example, in accordance with some implementations, the semiconductor material 155 may be a silicon alloy, such as silicon germanium or silicon carbide. In accordance with some implementations, the silicon alloy may be doped in-situ or ex-situ with dopants, such as boron or indium for p-type regions (for a p-channel transistor), or with dopants, such as arsenic, antimony or phosphorous for n-type regions (for an n-channel transistor).

After the fin 150 is formed, ohmic contacts for both the drain and source may be created. FIG. 1A illustrates an intermediate stage in the formation of a conforming ohmic contact for the transistor 100. More specifically, as illustrated for the drain in FIG. 1A, for this stage, a contact resistance reducing material 156 is formed on and directly contacts the semiconductor material 155, and a metal 158 is deposited on the material 155. In this manner, as further described herein, in accordance with some implementations, the contact resistance reducing material 156 may be an epitaxial silicide or germanide film; and the contact resistance reducing material 156 may be formed using an epitaxial deposition process (a VPE process, for example). Thereafter, the metal 158 may be deposited (using a PVD process, for example) on the contact resistance reducing material 156. As examples, the metal 158 may be silver, nickel, aluminum, titanium, gold, gold-germanium, nickel-platinum, nickel-aluminum, cobalt or any other metal.

In accordance with example implementations, after the metal 158 is deposited, a thermal reflow process (reflow annealing) may be used to apply thermal energy to the deposited metal to cause the metal 158 to flow to a portion of the material 155, which was not in the line of sight of the process that was used to deposit the metal 158 to cause the metal 158 to at least partially conform to this portion of the material 155. Reaction annealing may then be used to chemically react the metal 158 with the contact resistance reducing material 156 to form a metal compound, such as a silicide or a germanide.

Although a FinFET is described herein as an example of a non-planar, or 3-D, transistor, the systems, apparatuses, processes, and techniques that are described herein may be applied to other non-planar semiconductor structures. For example, in accordance with further implementations, a thermal reflow process may be used to form conforming ohmic contacts for a nanowire transistor. In a nanowire transistor, a nanowire is used instead of a fin, and the gate of the nanowire transistor generally surrounds the conductive channel on all sides. Accordingly, in accordance with some implementations, the nanowire transistor may have, for example, four effective gates.

Figure 1B:
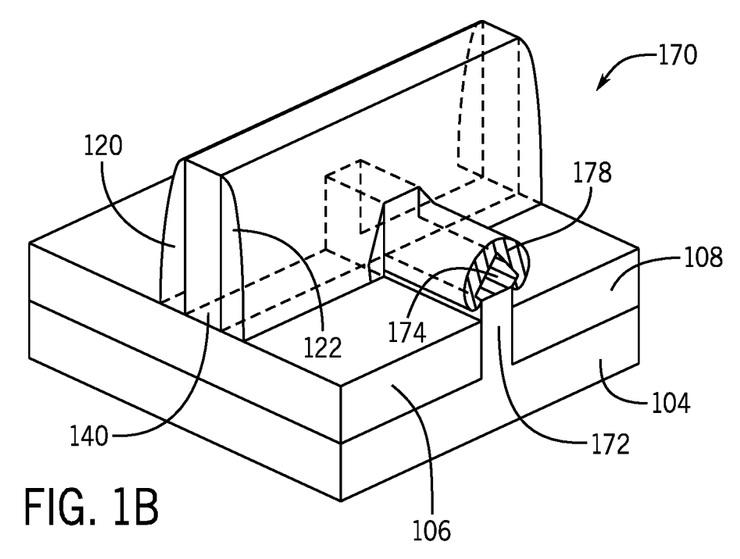

In accordance with further example implementations, the non-planar transistor may include one or multiple conductive channel structures that are extensions of the substrate. For example, referring to FIG. 1B, in accordance with further example implementations, a transistor 170 (here, a FinFET) may one or multiple fins 172 (one fin 172 being depicted in FIG. 1B) that are formed from the substrate 104. It is noted that the same reference numerals used in FIG. 1A are used in FIG. 1B to denote similar elements. As depicted in FIG. 1B, the fin 172 is an extension of the substrate 104 and extends between the isolation sections 106 and 108.

Dopants such as boron, aluminum, antimony, phosphorous, or arsenic may be selectively ion-implanted into the substrate 104 to form the source and drain regions of the fin 172. The ion implantation process may be followed by an annealing process that activates the dopants and may also cause them to diffuse further into the substrate 104.

Figure 2A:
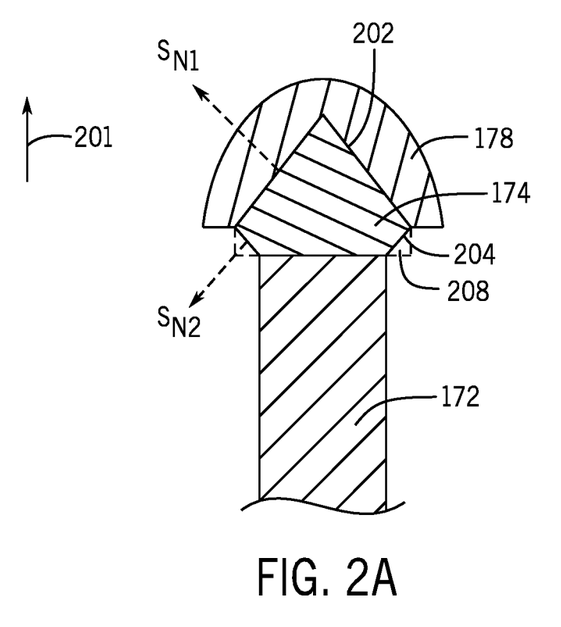
FIGS. 2A and 2B are cross-sectional views illustrating a process to form a conforming ohmic contact for a drain/source of a non-planar transistor according to an example implementation.

FIG. 1B illustrates an intermediate stage in the formation of a conforming ohmic contact for the transistor 170. Referring to FIG. 2A in conjunction with FIG. 1B, more specifically, for purposes of forming the ohmic contact, a contact resistance reducing material 174 (an epitaxial silicide or germanide, for example) may be deposited on the fin 172 (using an epitaxial deposition process, such as VPE, for example), and a metal 178 may be deposited (using PVD, for example) on the contact resistance reducing material 174. The deposited metal 178 may not entirely conform to the contact resistance reducing material 174. In this manner, as illustrated in FIG. 2A, the material 178 may be deposited on an upwardly facing surface 202 of the material 174, with a downwardly facing surface 204 of the material 174 being associated with a corresponding undercut 208, which is not in the line of sight of the process that is used to deposit the metal 178.

In this manner, the process that is used to deposit the metal 178 may be associated with a line of sight that generally corresponds to an angular range about a surface normal 201 of the substrate 104. For example, the upper surface 202 may be associated with a surface normal (called "$S_{N1}$" in FIG. 2A), that is within ±90° of the surface normal 201 and which correspondingly receives the deposited metal 178. However, the downwardly facing surface 204 may have a surface normal (called "$S_{N2}$" in FIG. 2A) that is oriented more than ninety degrees from the surface normal 201. Accordingly, the metal 178 is not deposited on the downwardly facing surface 204, as depicted in FIG. 2A.

In accordance with example implementations, a reflow annealing process (also called a "thermal reflow process" herein) may be used to extend the coverage of the metal 178 so that the metal 178 at least partially covers the downwardly-facing surface 204. More specifically, referring to FIG. 2B, in accordance with some implementations, thermal energy is applied and removed in a reflow annealing process for purposes of controllably melting the metal 178 and causing the metal 178 to flow at least partially into the undercut 208 and at least partially cover the surface 204 that is not in the line of sight of the metal deposition process. In accordance with some implementations, the reflow annealing process may be associated with a shorter time frame and lower temperatures than the time frame and temperatures used in a subsequent reaction annealing process, which is used to cause the metal 178 to react with the material 174 (to form a silicide or germanide, for example).

Figure 2B:
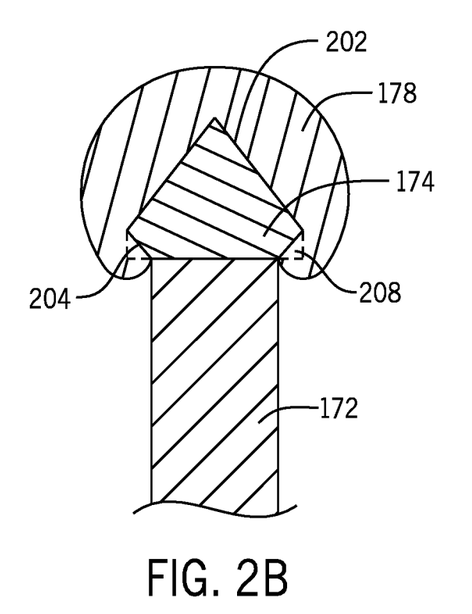

As a more specific example, in accordance with some implementations, the reflow annealing process includes heating the metal 178 to a temperature between 300 to 600° C. for a predetermined period. As a more specific example, in accordance with some implementations, the reflow annealing process may include linearly increasing the temperature of the transistor structure (i.e., heating the wafer) with respect to time over a predetermined temperature ramp up period (a period of 1 to 5 minutes, for example) until the temperature reaches a set point temperature (a temperature between 300 to 600° C., for example). Next, the set point temperature may be maintained for a predetermined period (a period of 1 to 5 minutes, for example), and subsequently, the temperature may be linearly reduced (with respect to time) over a predetermined temperature ramp down period (a period of 1 to 5 minutes, for example).

Figure 3:
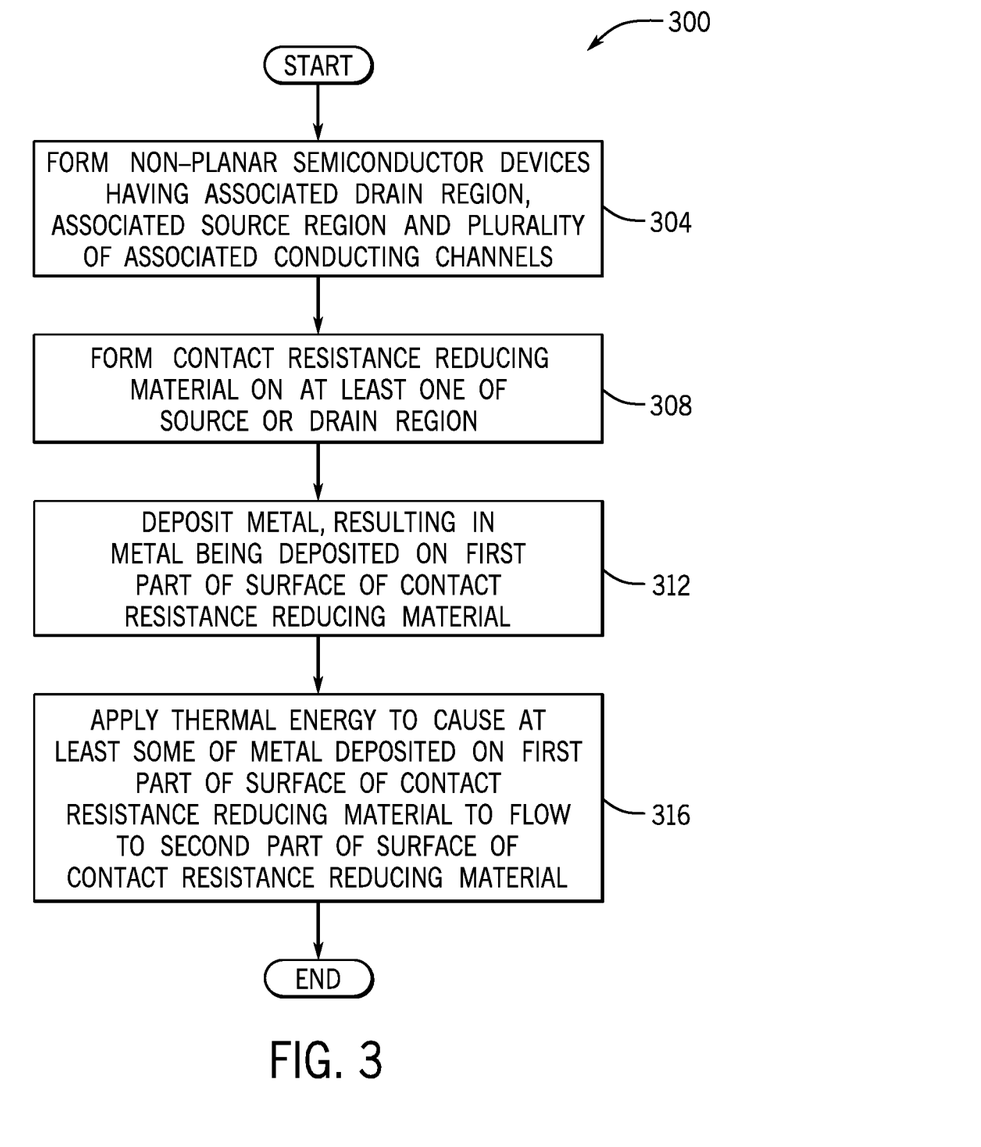
FIGS. 3 and 4 depict semiconductor fabrication processes according to example implementations.

Thus, referring to FIG. 3, in accordance with example implementations, a technique 300 to form an ohmic contact includes forming (block 304) a non-planar semiconductor device that has an associated drain region, an associated source region and a plurality of associated conductive channels. Pursuant to the technique 300, a contact resistance reducing material is formed (block 308) on at least one of the source or drain regions of the semiconductor device. Moreover, pursuant to block 300, a metal is deposited (block 312), resulting in the metal being deposited on a first part of the surface of the contact reducing material. Thermal energy may be applied, pursuant to block 316, to cause at least some of the metal deposited on the first part of the surface of the contact resistance reducing material to flow to a second part of the surface of the contact resistance reducing material.

Figure 4:
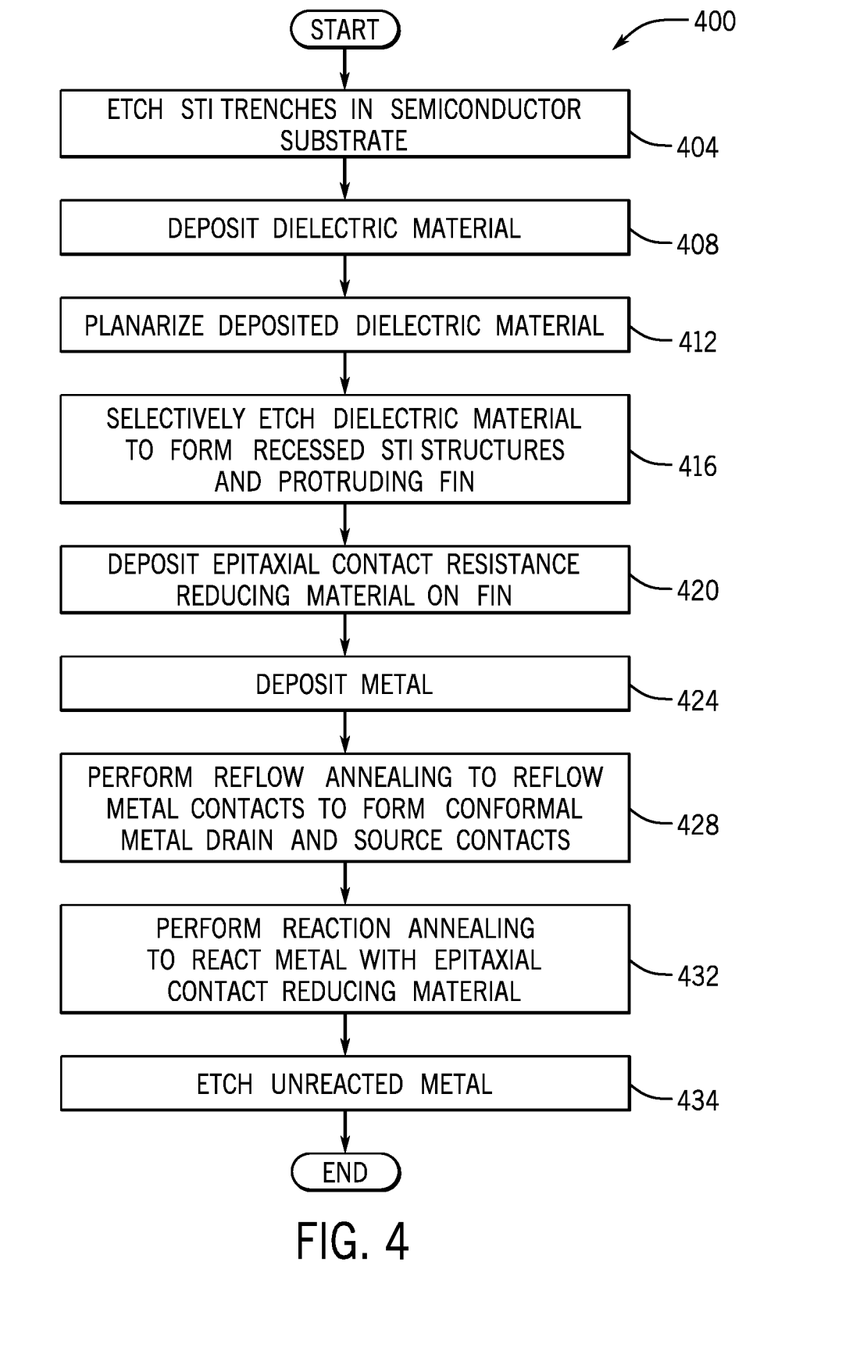

Referring to FIG. 4, as a more specific example, in accordance with some implementations, a technique 400 may be used to form conforming ohmic contacts on drain and source regions of a 3-D, or non-planar, transistor. The technique 400 involves the creation of structures 500, which are depicted in FIGS. 5A to 5I.

Figure 5A:
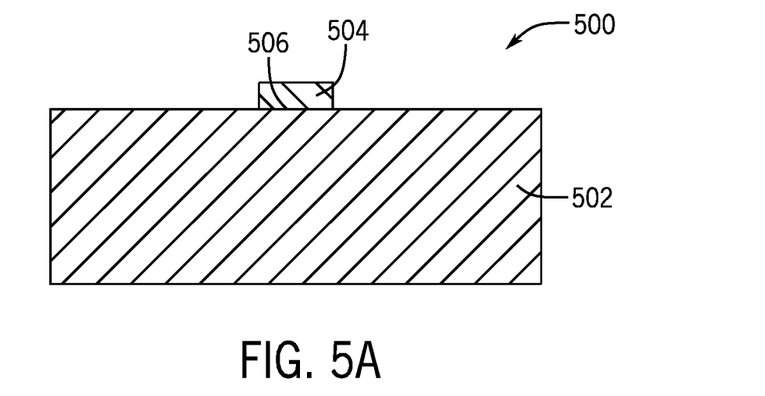
FIGS. 5A, 5B, 5C, 5D, 5E, 5F, 5G, 5H and 5I depict stages of a process to fabricate a non-planar transistor according to an example implementation.
Figure 5B:
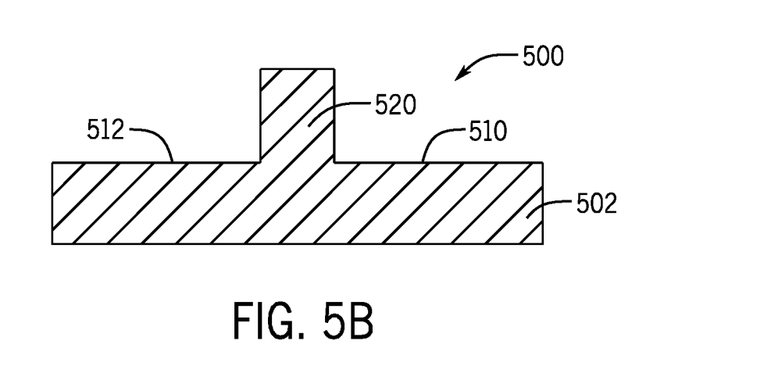

The technique 400 includes etching shallow trench isolation (STI) channels, or trenches, in a semiconductor substrate. In this manner, referring also to FIG. 5A, a patterned hard mask 504 may be used on a top surface 506 of a substrate 502 to pattern portions of the substrate 502, which will become corresponding fins. In this manner, the hard mask 504 may be formed by depositing hard mask materials (silicon dioxide, silicon nitride, and so forth) on the substrate 502, patterning resist on the portion of the hard mask that remains corresponding to the fins, and then stripping the pattern resist material, leaving the patterned hard mask 504 as illustrated in FIG. 5A. Other techniques may be used to form the hard mask 504, such as, for example, selectively depositing the hard mask 504 without using etching. Using the hard mask 504 to protect the fin regions, channels, or trenches 510 and 512 (see FIG. 5B), may then be etched into the substrate 502 to form substrate-based fins, such as substrate-based fin 520 depicted in FIG. 5B.

Figure 5C:
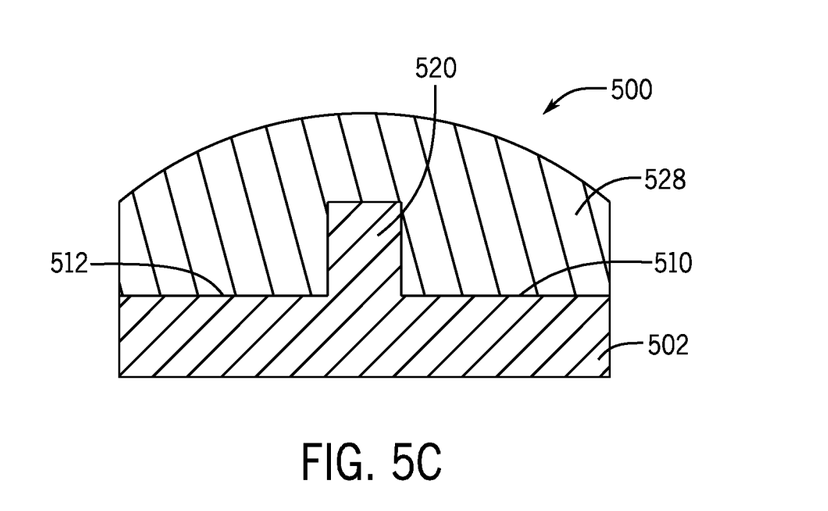

Next, pursuant to the technique 400, a dielectric material (silicon dioxide or any other suitable dielectric/insulative material) may be deposited (block 408) on the substrate 502. In this manner, FIG. 5C depicts a dielectric material 528 being deposited over the fin 520 and into the trenches 510 and 512.

Figure 5D:
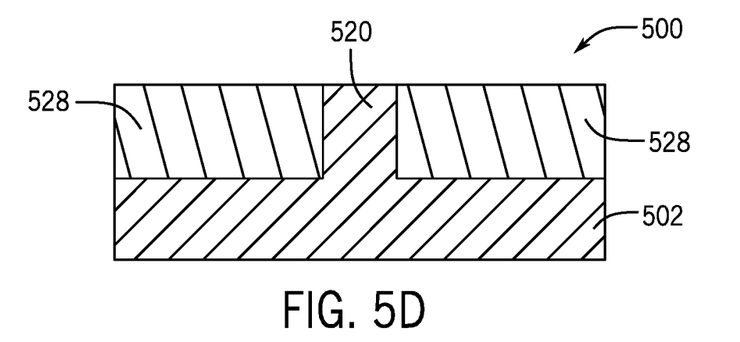

In accordance with some implementations, the dielectric material 528 may be planarized, pursuant to block 412, so that the top of the fin 520 is generally coplanar with the top surfaces of the planarized dielectric material 528, as illustrated in FIG. 5D. In accordance with some implementations, a chemical mechanical planarization (CMP) process, or other process may be used for purposes of planarizing the dielectric material 528.

Figure 5E:
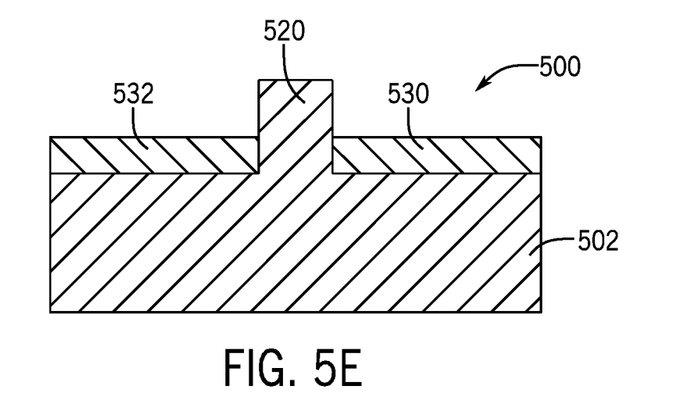

The technique 400 includes selectively etching the dielectric material 528 to form recessed STI structures 530 and 532 on either side of the fin 520, as depicted in FIG. 5E. Thus, at this point, the structure 500 includes the substrate-based fin 520 extending beyond the STI structures 530 and 532. The fin 520 may be ion implanted with a dopant, in accordance with example implementations.

Figure 5F:
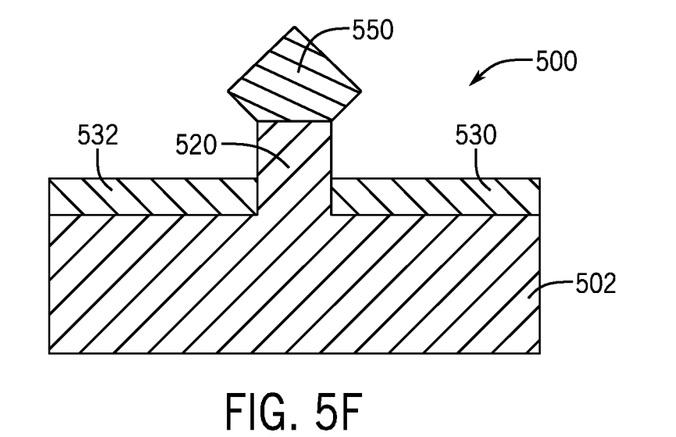
Figure 5G:
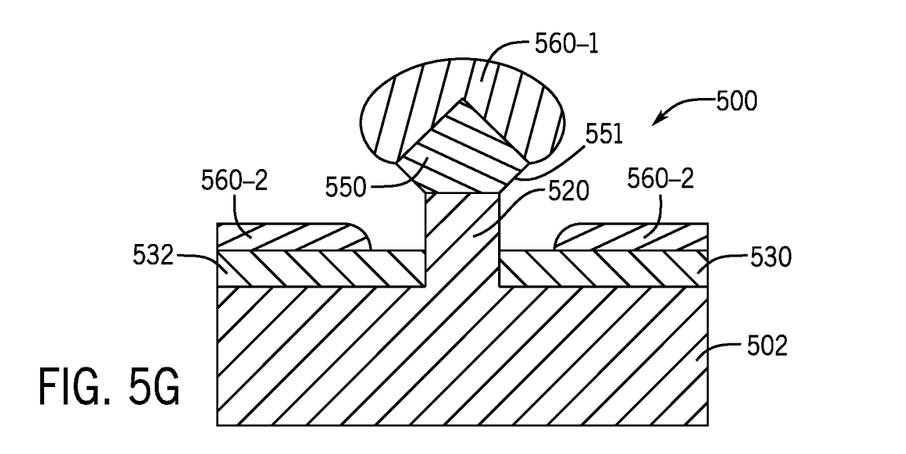

The technique 400 includes depositing (block 420) an epitaxial contact resistance reducing material 550 on top of the fin 520, as illustrated in FIG. 5F. As examples, the contact reducing material may be an epitaxial silicide or germanide film that is deposited using a VPE process. Subsequently, a metal is deposited (block 424) on the contact resistance reducing material 550, as depicted in FIG. 5G. The deposited metal includes a portion 560-1 on top of the contact resistance reducing material 550, as well as a portion 560-2, which is not on the material 550.

Figure 5H:
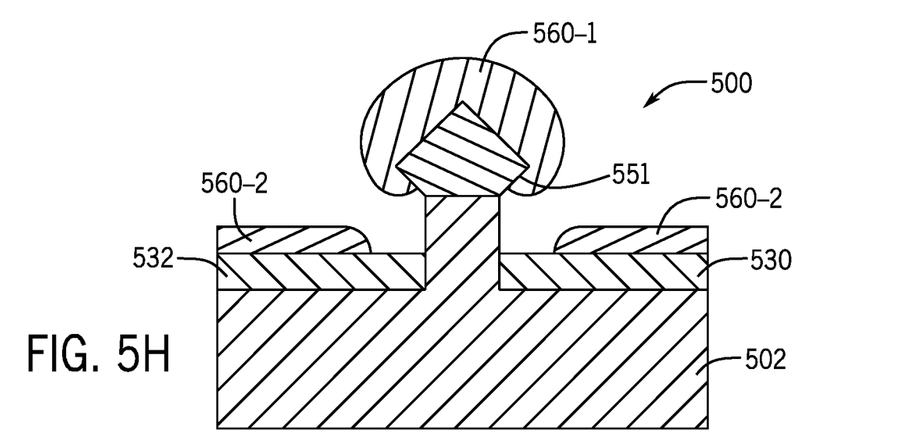
Figure 5I:
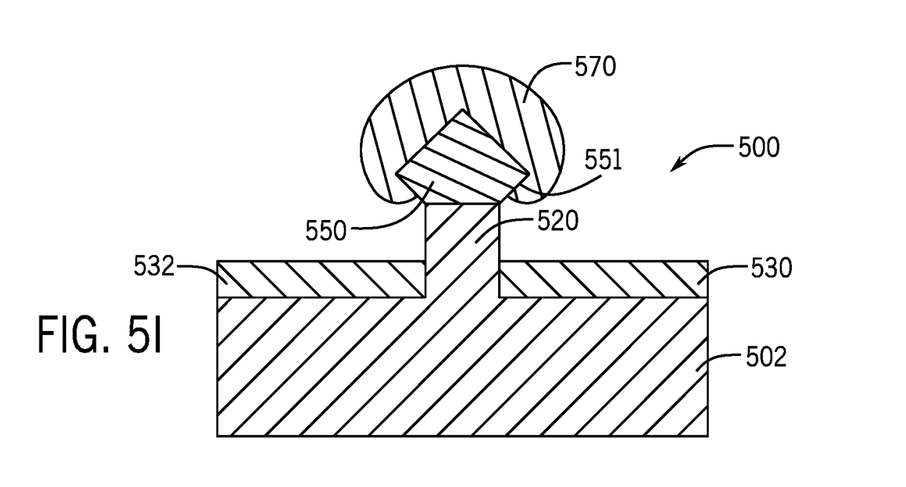

Reflow annealing may then be performed, pursuant to block 428, to flow the deposited metal 560-1 into regions that were not in the line of sight of the metal deposition process, as illustrated for example undercut region 551 of FIG. 5H. Reaction annealing may then be performed (block 432) to react the deposited metal 560-1 with the epitaxial contact reducing material 550 to form a compound (a silicide or germanide, for example). The unreacted metal (such as the metal 560-2 on the STI structures 530 and 532, for example) may then be etched (block 434) to remove the unreacted metal.

Figure 6:
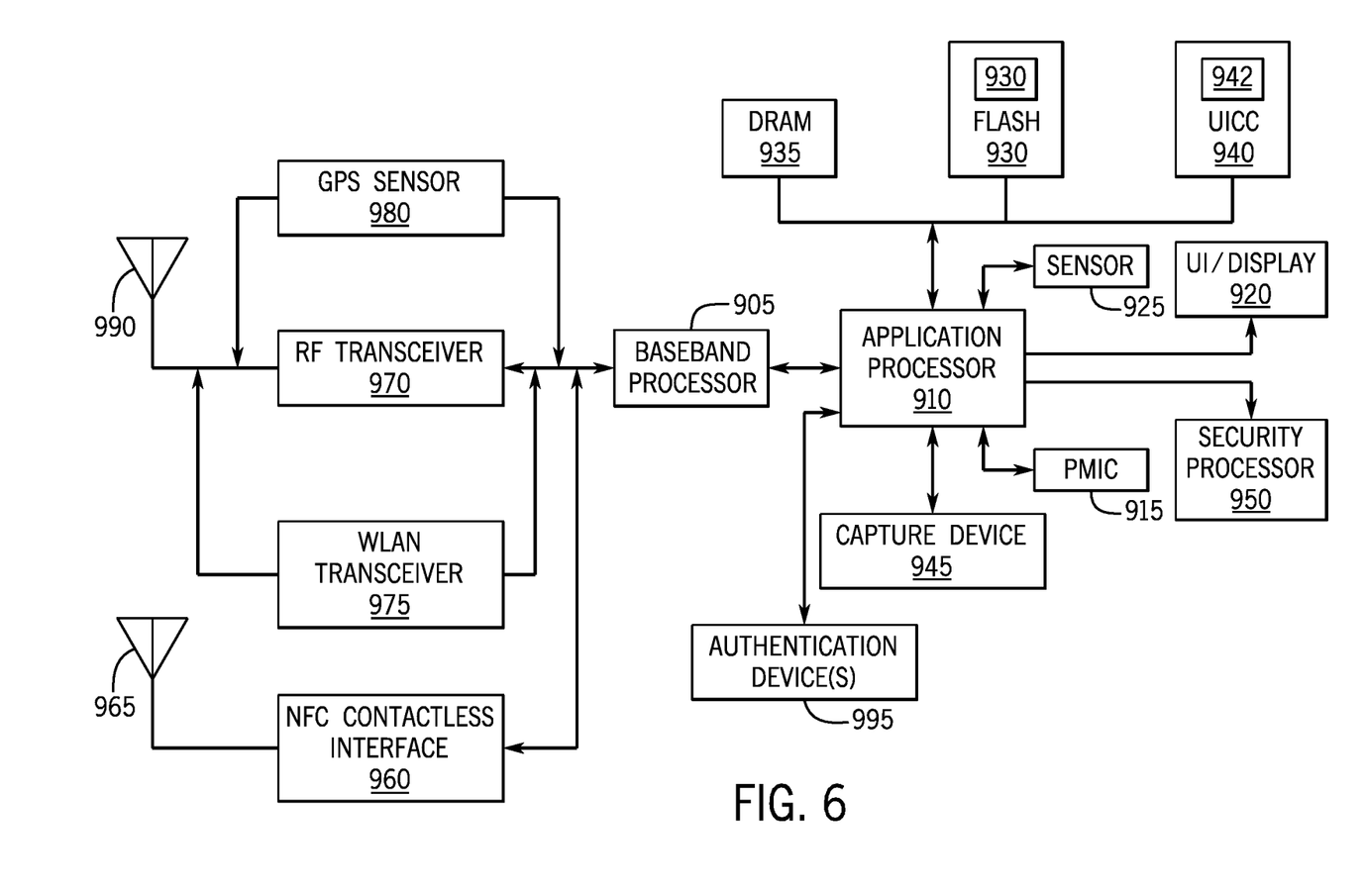
FIGS. 6 and 7 are schematic diagrams of systems according to example implementations.

Referring now to FIG. 6, in accordance with example implementations, a system may include integrated circuits, which contain non-planar transistors having conforming metal contacts, as described herein. The system, may be, as examples, a smartphone, a wireless communicator, or any other IoT device. A baseband processor 905 is configured to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some implementations, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 includes a subscriber identity module, which in some implementations includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 7:
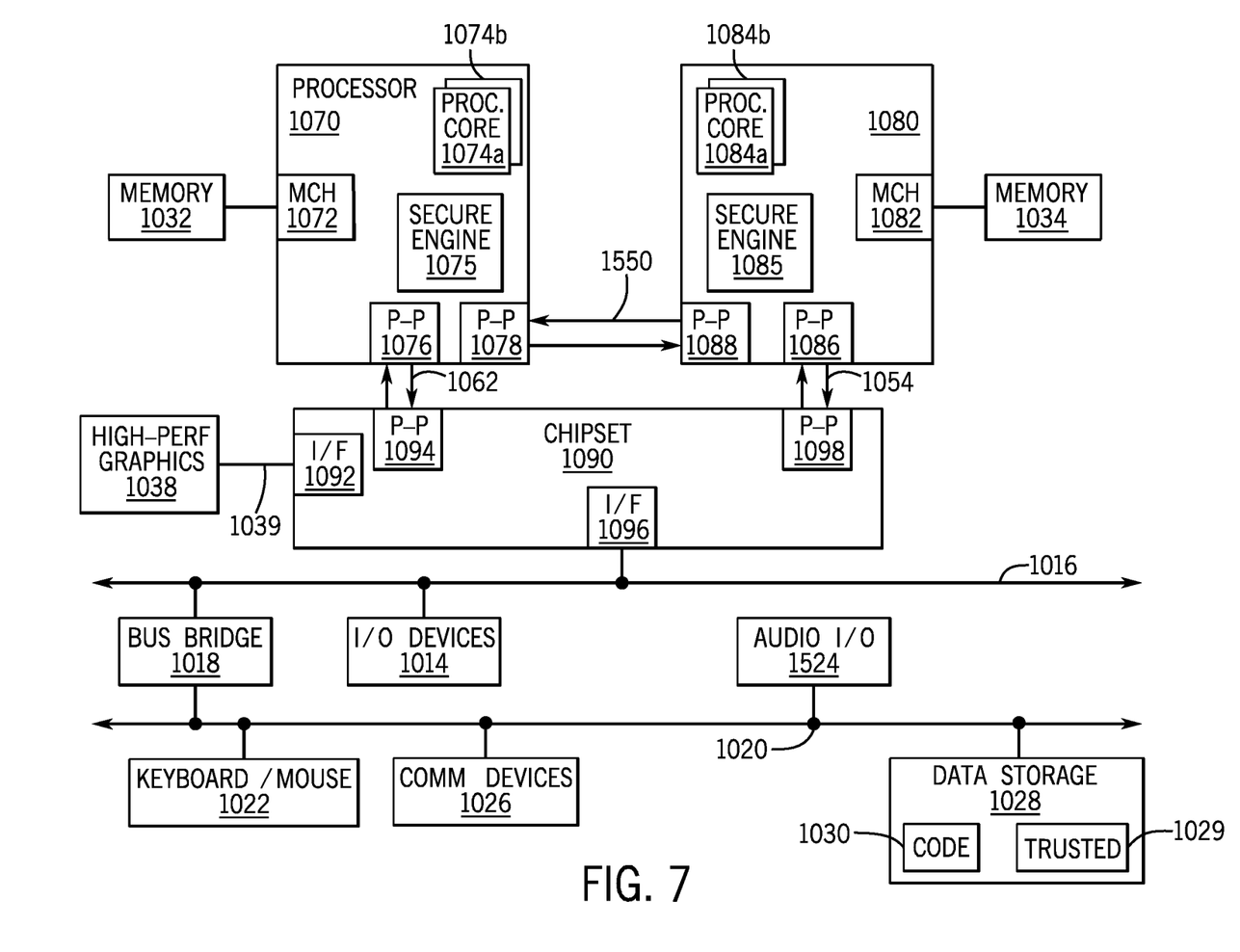

Referring to FIG. 7, in accordance with further example implementations, a multiprocessor system, such as a point-to-point interconnect system (a server system, for example), may include integrated circuits having non-planar transistors having conforming metal contacts, as described herein. The system may include a first processor 1070 and a second processor 1080 coupled via a point-to-point interconnect 1550. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

In accordance with example implementations, one or multiple integrated circuits or semiconductor devices may include non-planar transistors having conformal metal contacts, as disclosed herein. These integrated circuits may include integrated circuits containing the processor 910, the processor 1070, the memory 935, the memory 930, the memory 1032, the memory 1034 or the memory 1028, as just a few examples.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1062 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface

1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one implementation. As further seen, data storage unit 1028 also includes a trusted storage 1029 to store sensitive information to be protected. Further, an audio I/O 1524 may be coupled to second bus 1020.

Other implementations are contemplated and are within the scope of the appended claims. For example, in some implementations, a communication device may be arranged to perform the various and techniques described herein. In accordance with further example implementations, a device other than a communication device may be arranged to perform the various methods and techniques described herein.

Implementations may be used in many different types of systems. For example, in one implementation a communication device can be arranged to perform the various methods and techniques described herein. Of course, the scope of the present invention is not limited to a communication device, and instead other implementations can be directed to other types of apparatus for processing instructions, or one or more machine readable media including instructions that in response to being executed on a computing device, cause the device to carry out one or more of the methods and techniques described herein.

In accordance with example implementations, the techniques of FIGS. 4 and 6 may be implemented by executing machine executable instructions, or "program code," which is stored on non-transitory media. In this manner, the program code, when executed by one or multiple central processing unit(s), (one or multiple processing cores, and so forth) may cause the processor to fabricate at least one integrated circuit to perform one or multiple operations. Implementations (e.g., code for implementing the processes of FIGS. 3 and 4) may be implemented in code and may be stored on a non-transitory storage medium having stored thereon instructions which can be used to program a system to perform the instructions. Implementations also may be implemented in data and may be stored on a non-transitory storage medium, which if used by at least one machine, causes the at least one machine to fabricate at least one integrated circuit to perform one or more operations. As examples, the storage media may include semiconductor storage devices, magnetic storage devices, optical storage devices, and so forth. As more specific examples, the storage media may include floppy disks, optical disks, solid state drives (SSDs), compact disk read-only memories (CD-ROMs), compact disk rewritable (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further implementations.

Example 1 includes an apparatus that includes a non-planar semiconductor body and a contact for the semiconductor body. The contact includes an epitaxial material formed on and contacting the semiconductor body, where the epitaxial material has an undercut; and a second material formed on and contacting the epitaxial material, where the second material at least partially conforms to the undercut.

In Example 2, the subject matter of Example 1 can optionally include the apparatus including a substrate; the non-planar semiconductor body points away from the substrate in a first direction; the undercut having an associated surface normal; and an angle between the surface normal associated with the undercut and the first direction being greater than ninety degrees.

In Example 3, the subject matter of Examples 1-2 can optionally include the non-planar semiconductor structure body including a fin of a fin-based field effect transistor.

In Example 4, the subject matter of Examples 1-3 can optionally include the second material including a silicide or a germanide.

In Example 5, the subject matter of Examples 1-4 can optionally include the second material including a compound that includes silver, nickel, aluminum, titanium, gold, gold-germanium, nickel-platinum, cobalt or nickel-aluminum.

In Example 6, the subject matter of Examples 1-5 can optionally include the epitaxial material including a silicide or a germanide.

In Example 7, the subject matter of Examples 1-6 can optionally include the semiconductor body being associated with a conductive channel of a transistor, and the contact being associated with a source or drain of the transistor.

In Example 8, the subject matter of Examples 1-7 can optionally include a substrate, where the semiconductor body is an extension of the substrate.

Example 9 includes a system that includes a memory; and a processor coupled to the memory, where at least one of the processor and the memory includes an apparatus according to any of Examples 1 to 8.

Example 10 includes a method that includes forming a three-dimensional (3-D) semiconductor structure having an associated source region, an associated drain region and a plurality of associated conductive channel regions; forming a contact resistance reducing material on at least one of the source region or drain region, where the formed contact resistance reducing material includes an outer surface; depositing a metal, where depositing the material results in the metal being deposited on a first part of the outer surface of the contact resistance reducing material; and applying thermal energy to cause at least some of the metal deposited on the first part of the outer surface of the contact resistance reducing material to flow to a second part of the outer surface of the contact resistance reducing material.

In Example 11, the subject matter of Example 10 can optionally include forming the contact resistance reducing material including forming a second structure having at least one feature on which the deposited metal does not conform; and applying the thermal energy includes causing the deposited material to conform to the at least one feature.

Example 12, the subject matter of Examples 10-11 can optionally include the at least one nonconforming feature including an undercut region of the second structure.

Example 13, the subject matter of Examples 10-12 can optionally include the structure includes a fin of a fin-based field effect transistor.

In Example 14, the subject matter of Example 10-13 can optionally include the contact resistance reducing material including a silicide or a germanide.

In Example 15, the subject matter of Examples 10-14 can optionally include applying the thermal energy including heating the deposited metal to a temperature between 300 to 600 degrees Centigrade.

In Example 16, the subject matter of Examples 10-15 can optionally include forming the 3-D semiconductor structure includes forming the 3-D semiconductor structure as an extension of a semiconductor substrate.

In Example 17, the subject matter of Examples 10-16 can optionally include forming the 3-D semiconductor structure includes forming a trench in a semiconductor substrate and depositing a semiconductor material in the trench.

In Example 18, an apparatus includes a non-planar semiconductor body associated with a transistor, where the body has an associated source region, an associated drain region and a plurality of associated regions associated with a plurality of conductive channels; a first epitaxial material to directly contact the non-planar semiconductor body in the source region, where the first epitaxial material has an undercut; a second epitaxial material to directly contact the non-planar semiconductor body in the drain region, wherein the second epitaxial material has an undercut; a third material to directly contact the first epitaxial material and at least partially conform to the undercut of the first epitaxial material; and a fourth material to directly contact the second epitaxial material and at least partially conform to the undercut of the second epitaxial material.

In Example 19, the subject matter of Example 18 may optionally include the first epitaxial material including a silicide; the third material including a silicide formed by reacting a metal deposited on the first epitaxial material with the first epitaxial material; the second epitaxial material including a silicide; and the fourth material including a silicide formed by reacting a metal deposited on the second epitaxial material with the second epitaxial material.

In Example 20, the subject matter of Examples 18-19 may optionally include the transistor including a fin-based field effect transistor or a nanowire transistor.

The foregoing description of the implementations of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The implementations of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method comprising:
    forming a three-dimensional (3-D) semiconductor structure having an associated source region, an associated drain region and a plurality of associated conductive channel regions;
    forming a contact resistance reducing material on at least one of the source region or the drain region, wherein the formed contact resistance reducing material comprises an outer surface and forming the contact resistance reducing material comprises forming a second structure having an undercut feature;
    depositing a metal, wherein depositing the metal results in the metal being deposited on a first part of the outer surface of the contact resistance reducing material, and the deposited metal does not conform to the undercut feature;
    applying thermal energy to perform reflow annealing to cause at least some of the metal deposited on the first part of the outer surface of the contact resistance reducing material to flow to a second part of the outer surface of the contact resistance reducing material, wherein applying the thermal energy to perform the reflow annealing comprises causing the deposited metal to conform to the undercut feature; and
    after the reflow annealing, applying thermal energy to perform reaction annealing to react the metal with the contact resistance reducing material.

2. The method of claim 1, wherein the 3-D semiconductor structure comprises a fin of a fin-based field effect transistor.

3. The method of claim 1, wherein the contact resistance reducing material comprises a silicide or a germanide.

4. The method of claim 1, wherein:
    applying the thermal energy to perform the reflow annealing comprises applying a first range of temperatures over a first time frame;
    applying the thermal energy to perform the reaction annealing comprises applying a second range of temperatures during a second time frame;
    the first time frame is less than the second time frame; and
    the first range of temperatures is less than the second range of temperatures.

5. The method of claim 1, wherein forming the 3-D semiconductor structure comprises forming the 3-D semiconductor structure as an extension of a semiconductor substrate.

6. The method of claim 1, wherein forming the 3-D semiconductor structure comprises forming a trench in a semiconductor substrate and depositing a semiconductor material in the trench.

7. The method of claim 1, wherein performing the reflow annealing comprises:
    increasing a temperature of the 3-D semiconductor structure with respect to time over a predetermined ramp up period, wherein the predetermined ramp up period comprises a period between one and five minutes, and during the ramp up period, the temperature reaches a set point temperature between 300° C. to 600° C.; and
    maintaining the set point temperature for a predetermined period between one to five minutes.

8. The method of claim 7, further comprising:
    reducing the temperature of the 3-D semiconductor structure during a ramp down period, the ramp down period comprises a period of one to five minutes.

9. The method of claim 7, wherein increasing the temperature during the ramp up period comprises linearly increasing the temperature of the 3-D semiconductor structure.

* * * * *